United States Patent
Knips et al.

(10) Patent No.: US 7,073,105 B2
(45) Date of Patent: Jul. 4, 2006

(54) ABIST ADDRESS GENERATION

(75) Inventors: Thomas J. Knips, Wappingers Falls, NY (US); James W. Dawson, Poughkeepsie, NY (US); John D. Davis, Maybrook, NY (US); Douglas J. Malone, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 596 days.

(21) Appl. No.: 10/413,614

(22) Filed: Apr. 14, 2003

(65) Prior Publication Data

US 2004/0205405 A1 Oct. 14, 2004

(51) Int. Cl.
*G11C 29/00* (2006.01)
*G06F 12/00* (2006.01)

(52) U.S. Cl. .................. 714/719; 711/217
(58) Field of Classification Search ........ 714/718–720; 711/217–219
See application file for complete search history.

(56) References Cited

U.S. PATENT DOCUMENTS

| | | | | |
|---|---|---|---|---|
| 6,079,006 | A * | 6/2000 | Pickett | 711/213 |
| 6,631,086 | B1 * | 10/2003 | Bill et al. | 365/185.09 |
| 6,829,181 | B1 * | 12/2004 | Seitoh | 365/201 |
| 2002/0194557 | A1 * | 12/2002 | Park | 714/718 |
| 2004/0205435 | A1 * | 10/2004 | Knips et al. | 714/733 |

OTHER PUBLICATIONS

"Optimization of Address Generator Hardware" by Grant et al.European Design and Test Conference, The European Conference on Design Automation. ETC European Test Conference. Proceedings.Publication Date: Feb. 28-Mar. 3, 1994 p. 325-329.*

* cited by examiner

*Primary Examiner*—Albert Decady
*Assistant Examiner*—Cynthia Britt
(74) *Attorney, Agent, or Firm*—Lynn L. Augspurger; Richard M. Goldman (57) ABSTRACT

An array built-in, on-chip self test system for testing a memory array and a method of testing the memory array. The memory array has data input ports, data output ports, and address ports, and a data control subsystem, an address control subsystem, and a comparator. The data control subsystem generates and applies deterministic data patterns to the data input ports of the memory array. The address control subsystem generates addresses for application to the memory array in coordination with said data control subsystem, and includes a sequence counter, a count rate controller for the sequence controller, a count rate controller divider to control the number of cycles per address, an address controller to provide granular control of addresses, and an X-OR gate receiving an input from a sequence counter and from the address controller, the X-OR gate outputting an address bit to the memory array. The comparator compares the data inputted to the data input ports of the memory array from the data control subsystem with the data outputted from the data output ports of the memory array.

11 Claims, 7 Drawing Sheets

| first_op input | last_op input | Gate O1 output |
|---|---|---|
| 0 | 0 | Background Control Source Register |
| 0 | 1 | Last Control Source Register |
| 1 | 0 | First Control Source Register |
| 1 | 1 | UNDEFINED |

Figure 7

ABIST ADDRESS GENERATION

FIELD OF THE INVENTION

The invention described herein relates to Array Built In Self Test ("ABIST") apparatus and methods for random access memories, especially static random access memories (SRAM's).

BACKGROUND OF THE INVENTION

High speed, density and reliability requirements for computer system applications of random access memory arrays, especially static random access memory (SRAM) arrays, require efficient and effective test applications to process and manufacture viable components for subsequent incorporation into high end processor products. Manufacturing yield, and, ultimately, product cost are integral parts of the ability to design, manufacture, and sell computer systems in the marketplace. A key requirement to achieving leading edge technology implementations is the ability to provide for effective testing and diagnostics in the design/manufacturing process to lower overall technology cost prior to product volume ramp-up.

Efficient SRAM/DRAM designs stress the manufacturing process capability. This is because of the high device usage (gates and transistor elements) in a given area (smaller memory cells yield a higher number of bits per chip), and high end processor applications demand high memory bit usage. The drive for high gate density chips with a large number of gates per unit area results in an increased sensitivity to process defects over the accompanying logic, and this, in turn, drives the need to analyze, understand, and eventually reduce overall process defect density to achieve product yield and cost requirements.

To this end, integrated self test, and particularly for the memory arrays, Array Built In Self Test (ABIST) has been employed to provide deterministic test coverage ensuring high quality products. Assessment of test effectiveness and diagnosis of fails to initial manufacturing test and subsequent stress screens are critical to yield diagnostics and product reliability improvement efforts, as they are more realistic indicators than monitor structures. Monitor structures are easier to diagnose, but are only models of the product/process interaction, and are expensive from the perspective of area overhead and process productivity.

Execution of ABIST algorithms requires either explicit test programming for micro-programmable architectures or state machine based algorithms. An ABIST that is synchronous to an external test system, where an off-chip fail indicator is monitored on a cycle-by-cycle basis determines at which points in the test the array fails.

In an ABIST, generation of memory/array addressing is accomplished with a single or plurality of sequential counters. These sequential counters comprise the address space of the memory under test and can be divided into appropriate sub-groups representing the row/column and or subarray dimensions of the memory array under test. Current technology provides for incrementing and decrementing the address through the address space of the memory array, and can alter the significance of the address groups i.e. Ripple row addressing as least significant, then column, or ripple column addressing as least significant, then row to accomplish the intended test sequences. Some systems even provide for maximum address programmability to restrict the count of a wide counter implementation in order to provide self test capability for a plurality of memory array macros that have varying address sizes (width or dimension).

Traditional 'n'-sequence deterministic test only allows for test operations at individual memory cell locations to proceed along the address dimension set up as least significant, and a minimum of 'n' or a multiple of 'n' test cycles must pass before the target cell of an operation can be revisited to determine if it has been affected by preceding operations.

This process is adequate to provide n-sequential address testing of memory arrays, such as static memory arrays (SRAMs) utilizing clocked operations with memory cell recovery prior to subsequent operations. This is done through the use of counter control logic, and provisions for division of the address application rate to the memory array device under test (dut) can be made. This allows for multi-cycle per cell operations whereby a plurality of write or read (e.g. $R_x W_x R_x$) operations at each addressed location can be accomplished.

Alternative test methodologies to comprehensively test each memory location transitioning to and from each memory location (cell), referred to as $n^2$ addressing have been described in literature, and commonly used for characterization in the past, but are not widely used in clocked CMOS manufacturing test applications due to the prohibitively long test time and cost implications.

However, the capability to stress controlled address and address group transitions is becoming more important to test for long time constant effects and implement low level defect screens in a cost effective and flexible manner.

OBJECTS OF THE INVENTION

It is an object of the invention to provide an improved method and apparatus of address generation for programmable real time multi-n address function.

It is a further object of the invention to facilitate the capability to stress address transitions in a plurality of modes for the purpose of long time constant and history effects characterization and screening of both memory cell effects, and those effects that may exist in SRAM/DRAM support circuitry such as bit drivers, sense amplifiers and the like.

It is still a further object of the invention to facilitate a plurality of predetermined address stress groups built in to the ABIST test hardware.

It is yet a further object of the invention to facilitate cycle by cycle programmability to invoke address stress functions during the programmable test mode of the ABIST algorithm.

It is yet a further object of the invention to facilitate an advanced in-situ real time ABIST deterministic test address generation capability for flexible test development post hardware build.

It is still a further object of the invention to remove the restriction of traditional n-sequence deterministic test operations at individual memory array cell locations proceeding along the address dimension a minimum of 'n' or a multiple of 'n' test cycles before the target cell of an operation can be revisited to determine if it has been affected by preceding operations.

SUMMARY OF INVENTION

These and other objects are attained by the method and array built in self test apparatus described herein.

The array built-in, on-chip self test system described herein has data input ports, data output ports, and address ports, and a data control subsystem, an address control subsystem, and a comparator. The data control subsystem generates and applies deterministic data patterns to the data input ports of the memory array. The address control subsystem generates addresses for application to the memory array in coordination with the data control subsystem, and includes a sequence counter to provide granular control of addresses, a count rate controller for the sequence controller which may hold a memory array address constant in order to apply multiple write and/or read array signals for stressing the address.

The count rate controller divider controls the number of cycles per address. The apparatus includes an X-OR gate that receives an input from the sequence counter and from the address increment/address decrement controller. The X-OR gate outputs an address bit to the memory array. The X-OR gate receives an input from the sequence counter and from the address increment/address decrement counter, and in accordance with the output of the X-OR gate, provides an address bit or a complement of the address bit.

The comparator compares the data inputted to the data input ports of the memory array from the data control subsystem with the data outputted from the data output ports of the memory array, and may include failing address function capability for retaining failing addresses.

The memory array may be a stand-alone array chip. Alternatively, it may be embedded within a VLSI logic chip.

In the method and apparatus of the invention memory array cell locations can be construed to be the target cell, cell operations can be performed at this cell, followed by selectable operations on adjacent, or orthogonal, or opposing locations, and if desired, the target cell can be immediately revisited to assess impacts, before advancing to the next addressable location to establish it as the new target cell.

The method and apparatus of the invention exploits existing ABIST design hardware required to generate address test vectors for array products, by reusing existing address generation hardware, and supplementing it to provide for on-the-fly complement test address fields within the test sequence. These address registers, supplemented by on-the-fly programmability for read/write (R/W) and data provide a complete test generation capability in addition to the existing ABIST deterministic test capability. Usage of the programmable address generation method described herein is sufficient to fully describe a programmable test of a memory array for efficient (minimal hardware apparatus) real time test generation.

The method and apparatus of this invention provides an extremely cost effective solution to the problem of AC (high speed) memory array programmable test generation for long time constant/history effect mechanisms. Given that large on-chip memory macros are the primary semiconductor device yield drivers, they currently employ built in self test and some form of redundancy support for overall yield enhancement. This invention, by taking advantage of existing test infrastructure, adds only a small fraction of overhead to overall ABIST area.

This invention provides for flexible programmable test capability without the requirement of fixed, predetermined test operations built into semiconductor devices, and extends the capability of state machine and micro-programmable ABIST (built in self test) function to include additional address stress test capability that is definable post hardware build, and usable at all subsequent levels of test of the semiconductor device, both manufacturing and in-situ systems test if applicable.

DETAILED DESCRIPTION OF THE INVENTION

Figure 1:
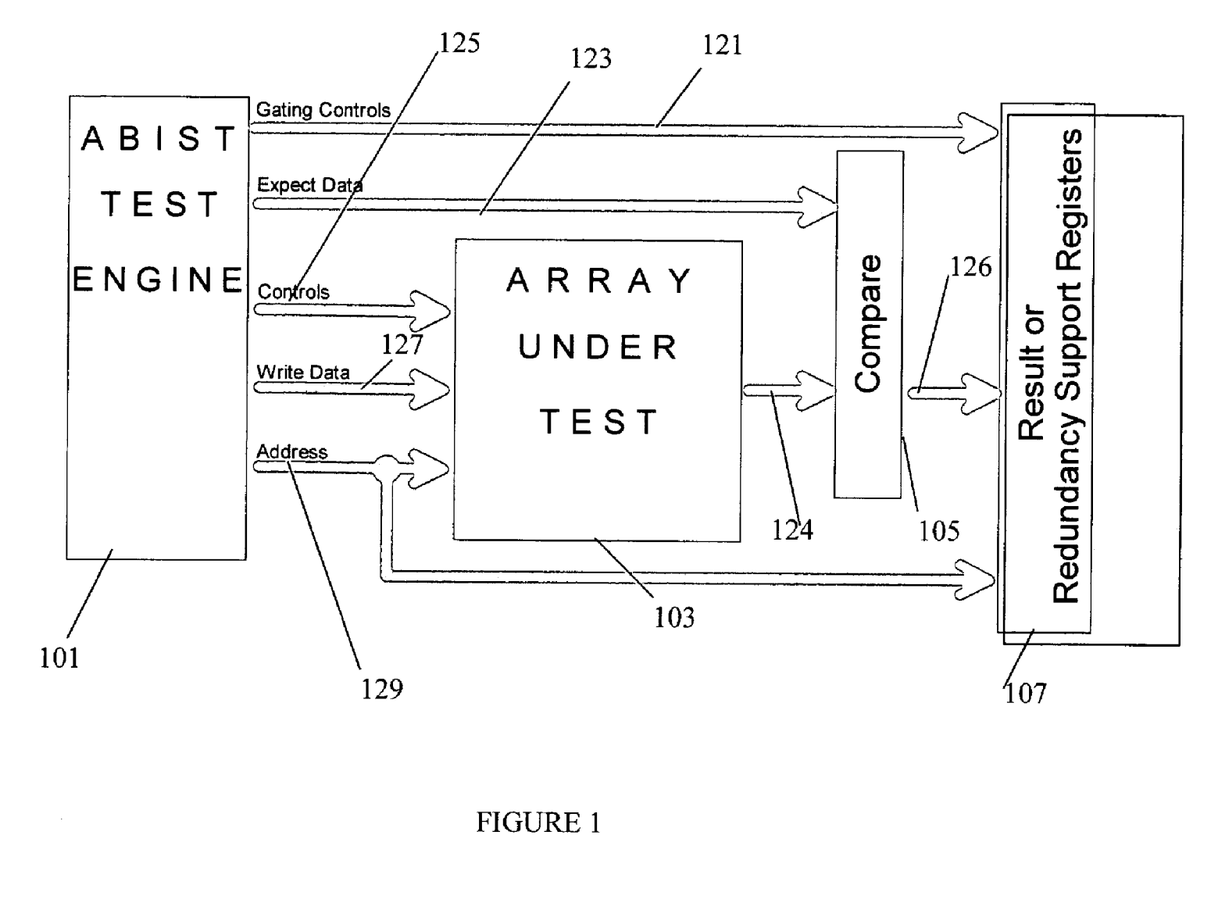
FIG. 1 illustrates a generalization of an ABIST—Array system support elements and their configuration in the method and apparatus of our invention. Specifically.

FIG. 1 illustrates a generalization of a plurality of possible ABIST—Array system support elements and their configuration useful in the method and apparatus of our invention. The redundancy allocation support referenced herein may be, but is not restricted to, two dimensional in reference to the row and column addressing through the address line, 129, within the structure of the memory array 103 under test. There may exist a plurality of redundant row and column elements thus supported by the Redundancy Support Registers. The self test engine 101 provides the deterministic array test patterns through controls 125, write data lines 127, and address lines 129. The compare function 105 has as its inputs the expected data vector 123 and the memory array outputs 124. It provides an overall pass/fail result signal 126 which is used in combination with the gating controls 121 from the self test engine 101 to control the redundancy support registers in establishing real time redundancy allocation.

Figure 2:
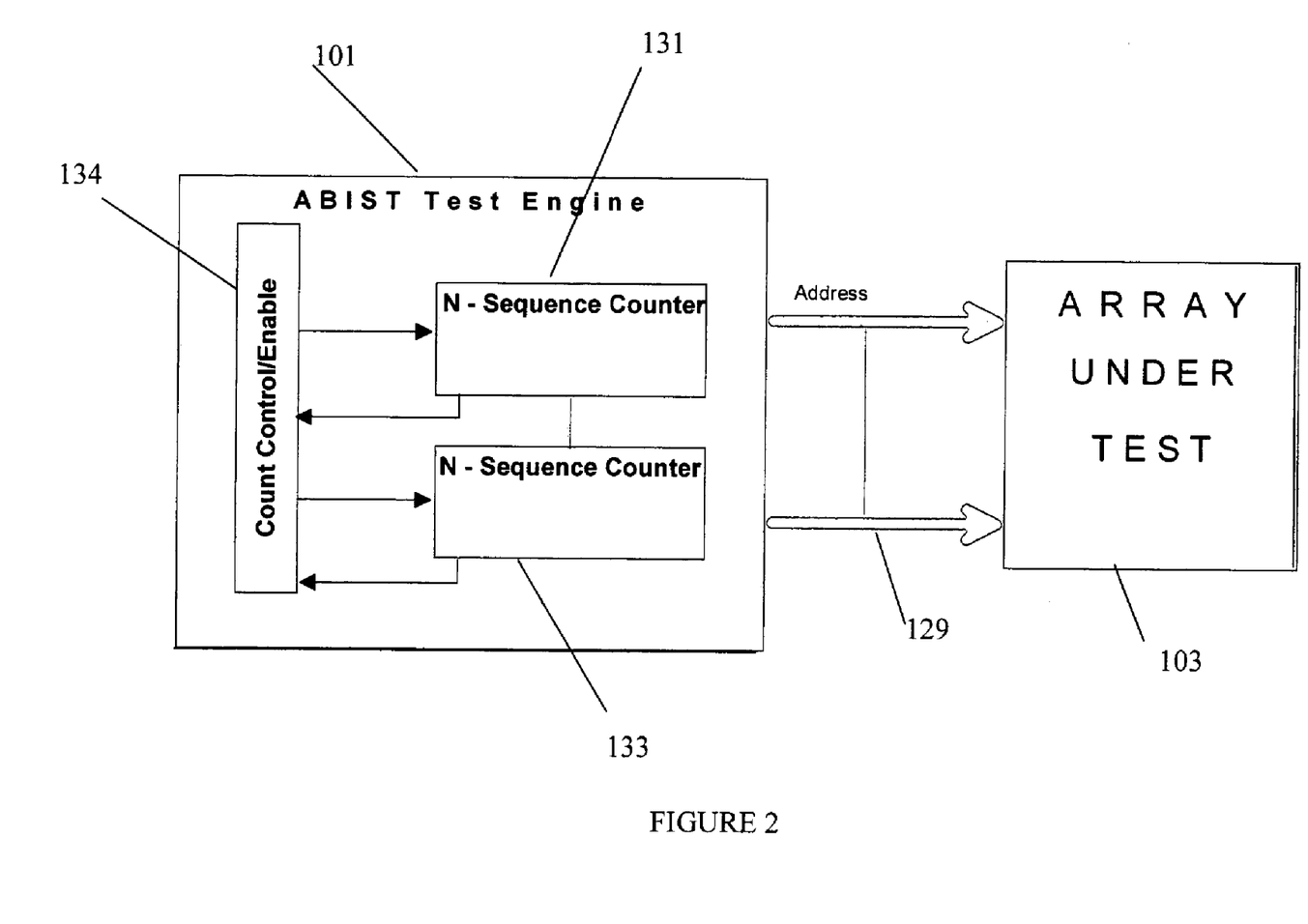
FIG. 2 illustrates the support elements detail possible, but not restricted to, for support of two dimensional memory array address generation.

FIG. 2 illustrates the support elements detail possible for, but not restricted to, support of two dimensional memory array address generation. There may exist a plurality of row and what will be referred to as column elements addressable within the memory array 103 structure, and possibly additional dimensions of addressing possible for sub-array or a plurality of larger memory element groupings.

In the ABIST art, one of the addressable element dimensions corresponds to the array rows in whole or in part. The other refers to the array columns in whole or in part. The N-Sequence counters 131, 133 must perform a dual function of counting up for increment address testing, and counting down for decrement address test generation and are served by a controller 134 that establishes which counter 131, 133 is least significant, thereby establishing a plurality of array addressing modes, namely ripple word (row), or ripple bit (column). The controller 134 also establishes the rate at which the counters 131, 133 sequence, thereby providing for multi-cycle per cell test capability in conjunction with the other internal ABIST engine controllers providing data and R/W operation control.

Figure 4:
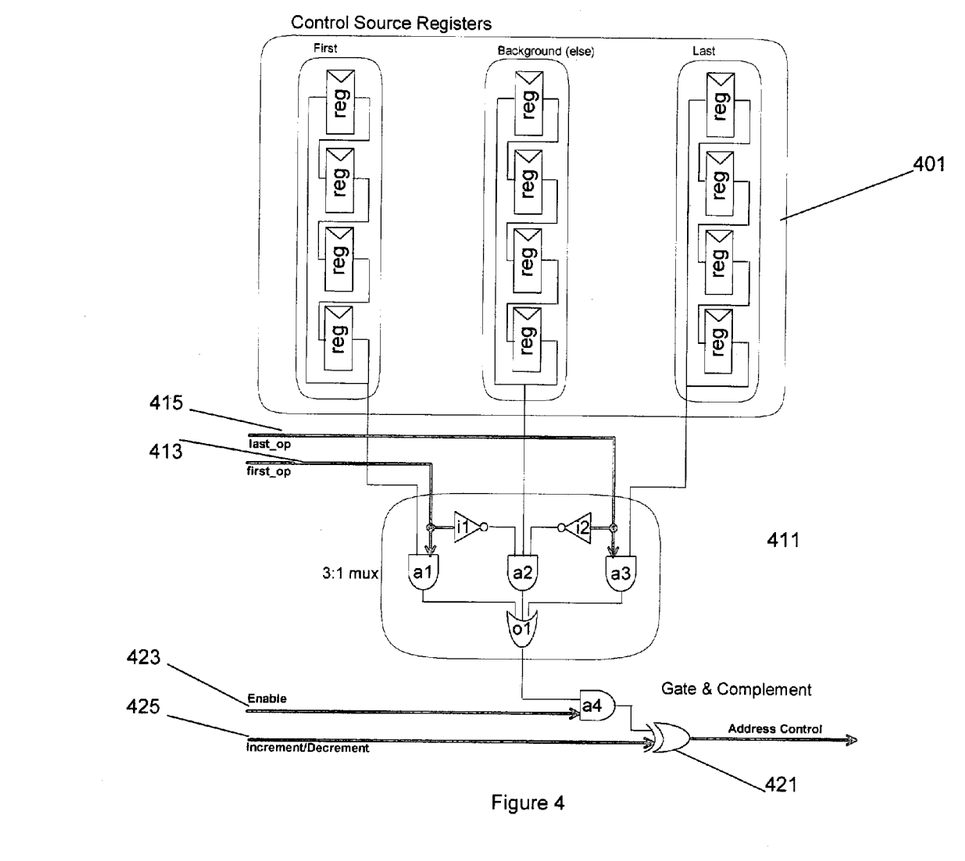
FIG. 4 illustrates that the apparatus is composed of three primary elements, rotate registers, a multiplexor, and a gate/complement function.

The preferred embodiment described herein relaxes the requirement of the n-sequence counters 131, 133 to also count down to provide decrement addressing function of the ABIST engine by simply establishing a bank of "XOR" logic gates 141 shown in FIG. 4 in the output address buss, that when controlled will "complement" the address buss to provide the decrement address function. This is not an absolute requirement of the embodiment, but an opportunity for address generator simplification, and provides efficiency in hardware utilization.

Figure 3:
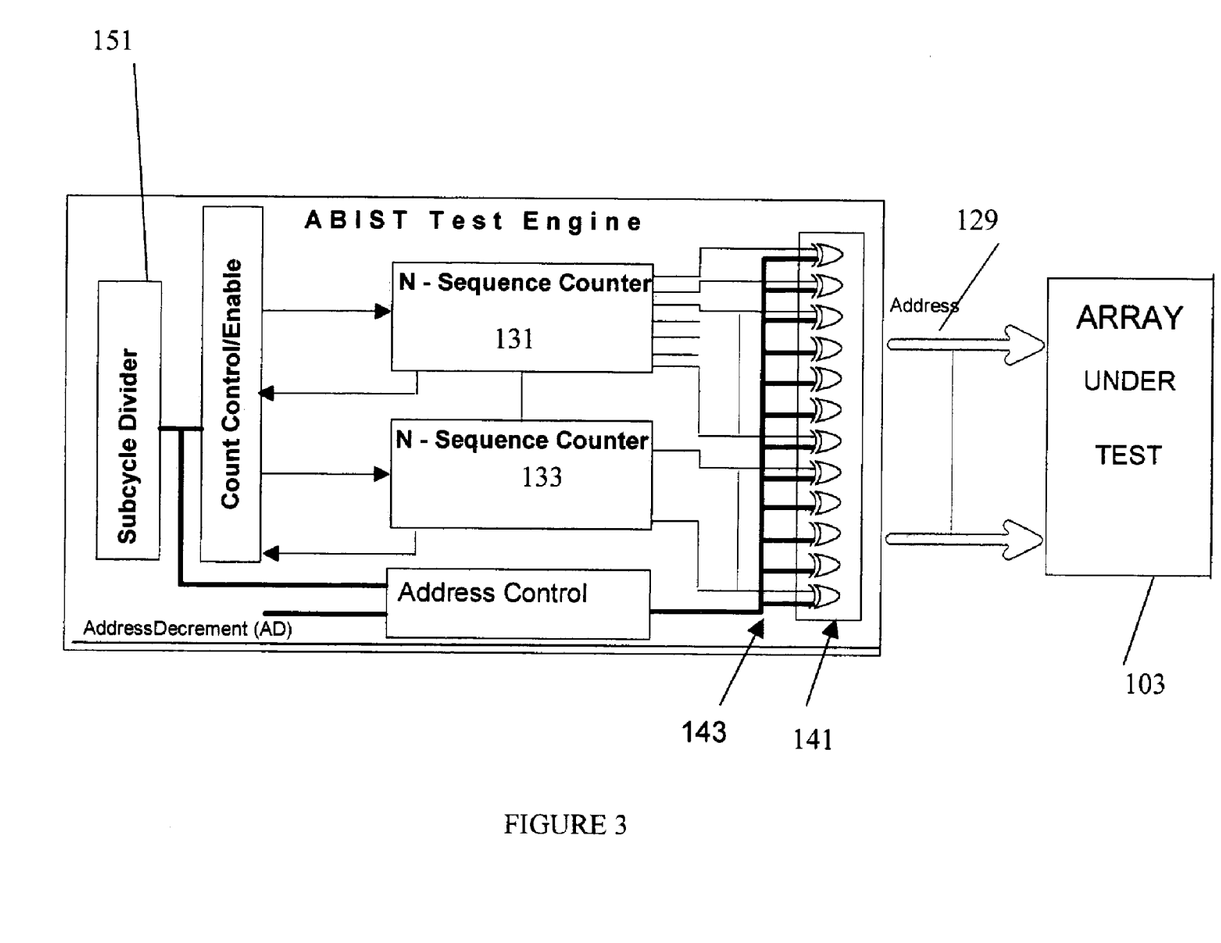
FIG. 3 illustrates the attachment for the enhanced address generation apparatus herein described.

FIG. 3 illustrates the attachment for the enhanced address generation apparatus. Note should be made that in typical support of address generation, a test engine state bit or program word bit referring to address count direction would be present and usable. In addition, a subcycle counter/divider 151 that would be used to divide the frequency of the address generator for multicycle per cell address tests, would be present, and expanded in this preferred embodiment, but not restricted to the limit of its expansion. For the purposes of this preferred embodiment, each memory addressing bit is wired through one input of an XOR logic gate 141. The second input is fed by control signals 143 providing the granular control over the address buss fed to the array device 103 under test. While performing standard n-sequential address tests, these control signals are static providing the address generator mode of increment if '0' or decrement if '1'.

The enhanced address generation apparatus is not intrusive in existing ABIST designs. As can be seen, its function is to process the generated address counter data independent of the remaining ABIST elements. Through programmable elements in the address control block, the output address buss 129 to the array 103 under test can be transparent, that is equivalent to the N-Sequence counter 131, 133 outputs providing increment address function to the array 103 under test. Or, the output address buss 129 can be made a static complement of the N-sequence counter outputs, providing a decrement address sequence to the array under test.

The method and apparatus detail of the "Address Control" in FIGS. 3 and 4. FIG. 4 illustrates that the apparatus is composed of three primary elements, rotate registers, 401, a multiplexor, 411, and a gate/complement function, XOR gate 421. The primary input labeled Enable 423 feeding a logic AND function, gate a4, which when inactive (state '0') from the ABIST state machine controller, holds off function of this address controller, and allows normal ABIST state machine control of primary input AD (shown in FIG. 3) to be active through to the primary output address control of the address control block (shown in FIG. 3). It is this primary output from FIG. 3 that controls the address buss XOR gate elements 421. Therefore, when the address control block input Enable 423 and address decrement input AD are '0', the address buss feeding the array 103 under test is equal to the N-Sequence counter outputs directly (increment address mode). When the address control block input Enable is '0' and address decrement input AD is '1', the address buss feeding the array under test is equal to the complement of the N-Sequence counter outputs, or decrement address mode.

To be noted is the address control line sourced by XOR gate 421 (FIG. 4), and labeled 143 in FIG. 3, that feeds the address out XOR gate 141 in FIG. 3. This gate and line are not restricted to a single line, but include a signal bus that allows individual control of complementary individual address bits. This individual control, which we refer to as "granularity", is provided by using multiple enable bits, 423 of FIG. 4. This provides the granular control of the address bus, resulting in the capability illustrated in FIG. 6. Absent this capability only the pure complement of a generated address would be available.

Gate a4 and XOR gate 421 can be vectored to provide multiple output bits.

Figure 7:
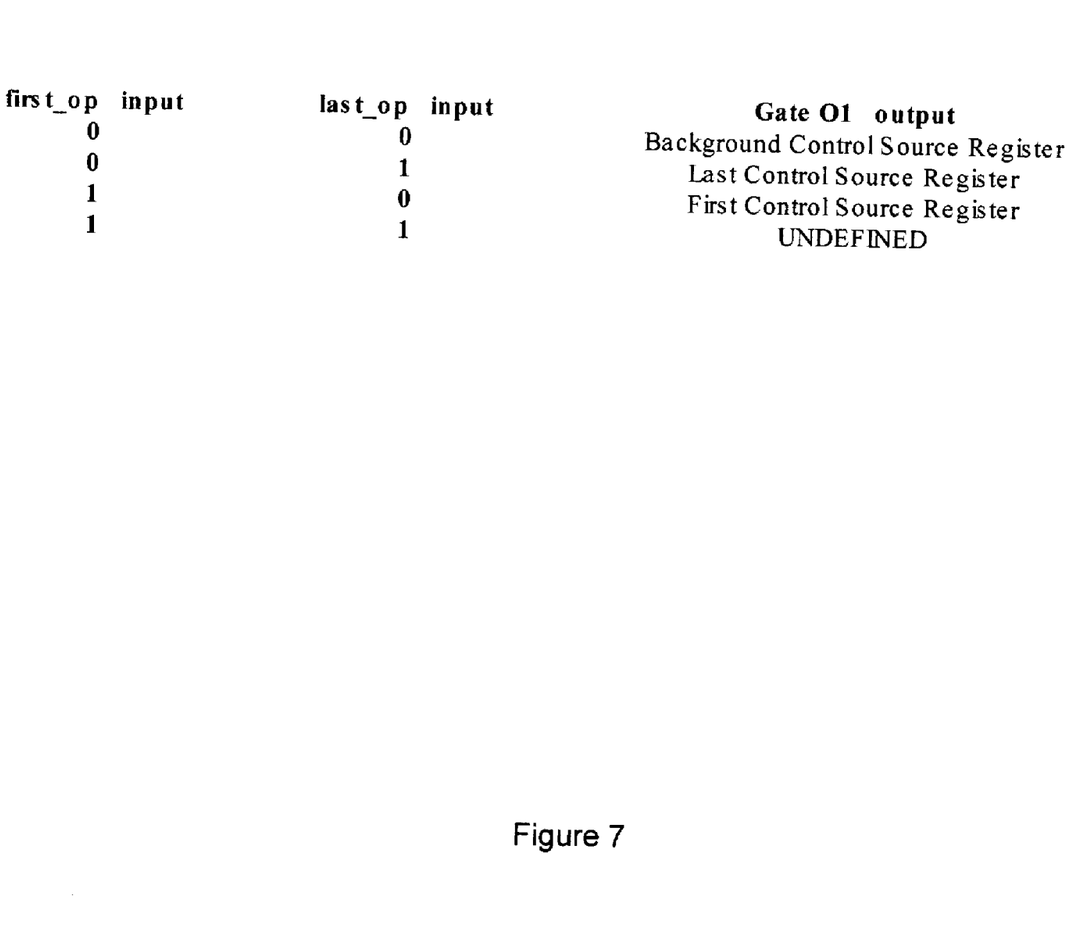
FIG. 7 (Table 1) illustrates how the contents of one of the three control source registers are used to provide control signals to the address control primary output.

Now we can consider the mode when the address control block is enabled with primary input Enable at '1'. This enables the output of the 3:1 multiplexor composed of logic gates a1, a2, a3, and o1 to modify the address control primary output. Inputs first_op 413 and last_op 415 are defined to be mutually exclusive, that is one or the other can be high, but not both, although both can be low, or logic "0". This enables the contents of one of the three control source registers to provide control signals to the address control primary output. This is illustrated with particularity in the Table of FIG. 7.

The Control Source Registers 401 are implemented as, but not restricted to, four bit rotate register configurations with appropriate and required control signals to synchronize and allow register updates as desired.

The apparatus and method provide a non-static control to the output bank of XOR logic gates 141 of FIG. 3 during a device test. Applying granular control over the states of the address buss in combination with count rate of the N-sequence counters, results in extremely powerful address generation capability for 2N address tests, address and array peripheral circuit stress patterns, and unique data capability for cell target stress.

This is illustrated by the following example. Given that the N-sequence counter is an 8 binary bit (256 state) counter, with a control setting that divides the counting rate by an arbitrary factor, here 4, for example, the array under test would normally see the first initial state of the n-sequence counter, all binary 0's which we will define as address decimal 0 for four test cycles. Then as the n-sequence counter advances to state 1, for four additional cycles and so on. This would result in an address application to the array under test of a four cycle per cell address mode where the array sees on the incoming address buss the following cycle by cycle sequence:

address 0, 0, 0, 0, 1, 1, 1, 1, 2, 2, 2, 2, 3, 3, 3, 3, 4, 4, . . .

Address 0 is exercised along with transition to address 1, but it cannot be revisited until the n-sequence counter completes the full address space of the memory array under test, and re-initializes or wraps back to address 0.

Now if the proposed address control apparatus outputs are set to '0' on the first cycle, and '1' on the second cycle, and changes at this rate for the duration of the address application, then the array under test address buss will sequence in the following manner:

Address 0, 255, 0, 255, 1, 254, 1, 254, 2, 253, 2, 253, 3, 252, 3, 252, 4, 251, . . .

Figure 5:
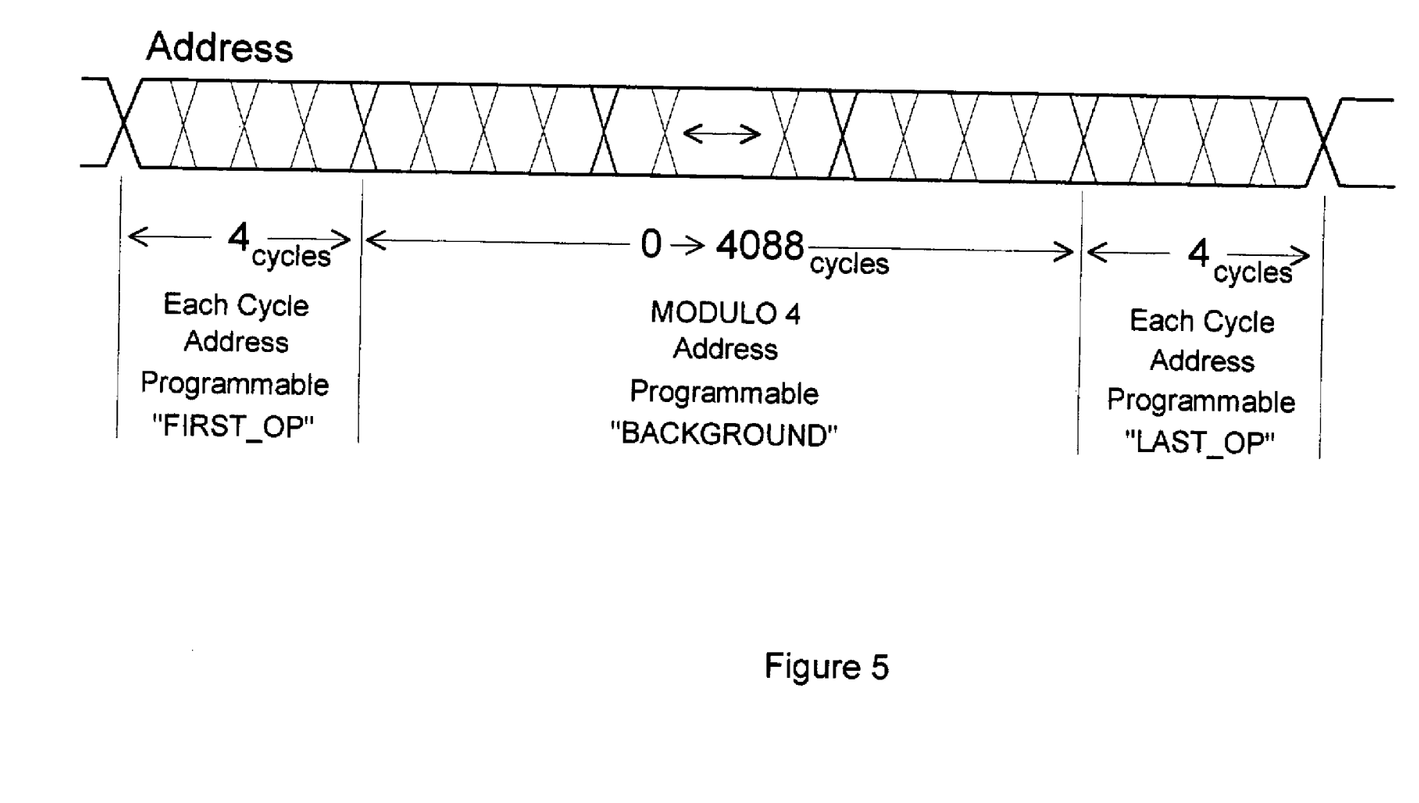
FIG. 5 illustrates an example where an N-sequence counter output can be modified with a control setting that divides the counting rate by a factor, for example, up to 4096.

What has effectively been generated is a multi-N address sequence to the array under test. Now if the divide rate is set to a high value e.g. 1024, and the address control apparatus outputs are set to '0' on the first cycle, '1' for subsequent cycles until a '0' is set on the last of the 1024 cycles, with this pattern repeating, then the array will see on the incoming address buss the following cycle by cycle sequence (as illustrated in FIG. 5):

Address 0, 255, 255, 255, . . . 255, 255, 0, 1, 254, 254, 254, . . . 254, 254, 1, 2, 253 . . .

This provides a long time away from the target cell, in between target cell operations, before the N-Sequence counters are advanced and the operation repeats on the new target cell.

Figure 6:
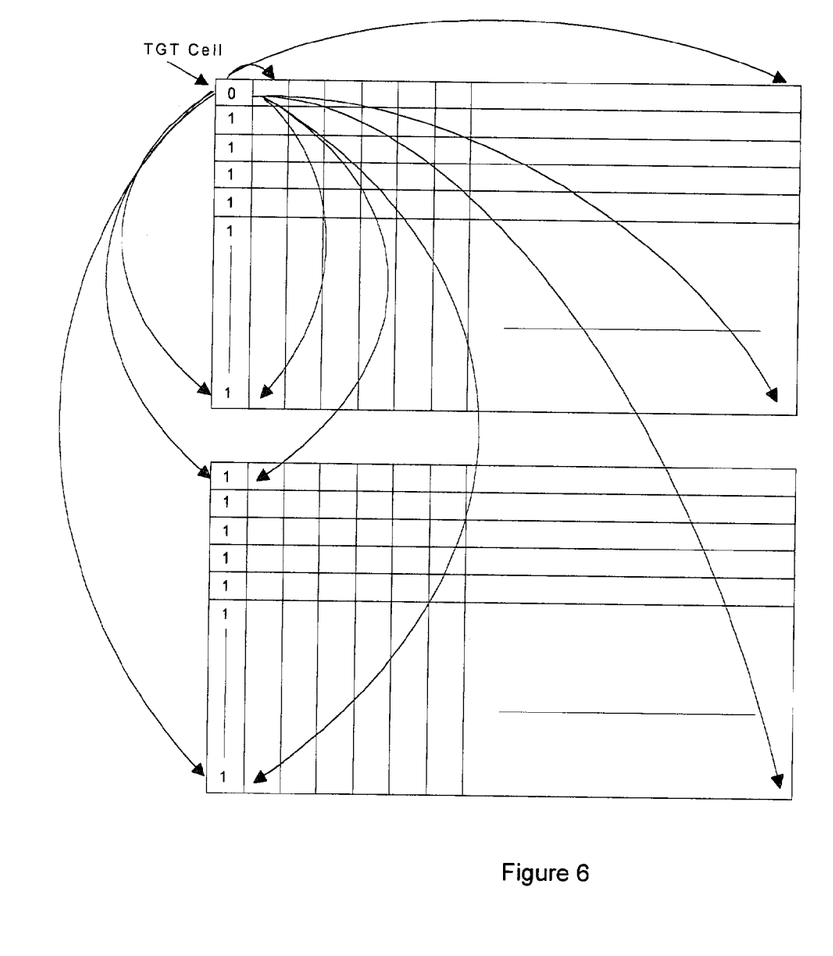
FIG. 6 illustrates address jump options.

By providing an adjustable divide rate of the n-sequence counter and providing individual Enable signals 423 (FIG. 4) to the control apparatus, multiple address control outputs 143 (FIG. 3) are realized. A myriad of test designs can then be accommodated to target repetitive cell access operations, or, target cells can be visited, and then left alone for significant test periods before returning for measurement, with minimal hardware resources, and flexible programming capability, as illustrated in FIG. 6 which shows sets of addressing patterns for different factors.

While the invention has been described with respect to certain preferred embodiments and exemplifications, it is not intended to limit the scope of the invention thereby, but solely by the claims appended hereto.

We claim:

1. An array built-in, on-chip self test system for testing a memory array having data input ports, data output ports, and address ports, comprising in combination:
   a data control subsystem for generating and applying deterministic data patterns to the data input ports of said memory array;
   an address control subsystem for generating addresses for application to said memory array in coordination with said data control subsystem, said address control subsystem comprising, in combination:
   a. a count controller for the sequence counters,
   b. a count rate controller divider to control the number of cycles per address,
   c. an address increment/address decrement controller, and
   d. an address controller with X-OR gates receiving inputs from the address increment/decrement control and a gated control source register with multiple enable signals, to provide granular control of addresses, and
   e. X-OR gate outputting an address bit to the memory array; and
   a comparator for comparison of data inputted to said data input ports of said memory array from said data control subsystem with data outputted from said data output ports of said memory array.

2. An array built-in, on-chip self test system for testing a memory array according to claim 1, wherein said comparator includes failing address function means for retaining failing addresses.

3. An array built-in, on-chip self test system for testing a memory array according to claim 1, wherein the count rate controller holds an array address constant in order to apply multiple write and/or read array signals for stressing said address.

4. An array built-in, on-chip self test system for testing a memory array according to claim 1 wherein said X-OR gates receive inputs from the sequence counter and from a multi-output programmable address controller, and in accordance with the output of the X-OR gate, provides an address bit or a complement of the address bit.

5. An array built-in, on-chip self test system for testing a memory array according to claim 1, wherein said array is a stand-alone array chip.

6. An array built-in, on-chip self test system for testing a memory array according to claim 1, wherein said array is embedded within a VLSI logic chip.

7. A method of testing a memory array having data input ports, data output ports, and address ports, comprising:
   generating and applying deterministic data patterns to the data input ports of said memory array;
   generating addresses for application to said memory array in coordination with said data comprising the steps of:
   a. providing granular control of address bits,
   b. controlling the count rate of the address bits;
   c. dividing the count rate to control the number of cycles per address, and
   d. exclusive OR gating address bit signals and address increment/address decrement signals and outputting an address bit to the memory array; and
   comparing data inputted to said data input ports of said memory array with data outputted from said data output ports of said memory array.

8. A method of testing a memory array according to claim 7 comprising retaining failing addresses.

9. A method of testing a memory array according to claim 8 holding an array address constant in order to apply multiple write and/or read array signals for stressing said address.

10. A method of testing a memory array according to claim 8, wherein said count rate controller divider holds an array address constant and applies multiple write and/or read array signals for stressing said address.

11. A method of testing a memory array according to claim 8 X-OR gating an input from the sequence counter and from the address increment/address decrement counter, and providing either an address bit or a complement of the address bit.

* * * * *